United States Patent
Shim

(10) Patent No.: US 8,872,282 B2
(45) Date of Patent: Oct. 28, 2014

(54) SEMICONDUCTOR DEVICE

(75) Inventor: Jeoungchill Shim, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/603,310

(22) Filed: Sep. 4, 2012

(65) Prior Publication Data

US 2013/0099325 A1 Apr. 25, 2013

(30) Foreign Application Priority Data

Oct. 21, 2011 (JP) .................................. 2011-231495

(51) Int. Cl.

| | | |
|---|---|---|
| *H01L 27/088* | (2006.01) | |
| *H01L 27/085* | (2006.01) | |
| *H01L 29/66* | (2006.01) | |
| *H01L 21/70* | (2006.01) | |
| *H01L 21/336* | (2006.01) | |
| *H01L 29/812* | (2006.01) | |
| *H01L 27/06* | (2006.01) | |
| *H01L 29/10* | (2006.01) | |

(52) U.S. Cl.
CPC .......... *H01L 29/812* (2013.01); *H01L 29/8126* (2013.01); *H01L 27/0605* (2013.01); *H01L 29/1029* (2013.01)
USPC ........... 257/401; 257/255; 257/327; 257/368; 438/197

(58) Field of Classification Search
CPC .............. H01L 29/812; H01L 27/0605; H01L 29/1229; H01L 29/1029; H01L 29/8126

USPC ................... 257/401, 255, 327, 368; 438/197
See application file for complete search history.

(56) References Cited

U.S. PATENT DOCUMENTS

| | | | |
|---|---|---|---|
| 2006/0014338 A1* | 1/2006 | Doris et al. .................... | 438/197 |
| 2007/0001219 A1* | 1/2007 | Radosavljevic et al. ...... | 257/327 |
| 2007/0241414 A1* | 10/2007 | Narihiro ........................ | 257/401 |
| 2008/0017934 A1* | 1/2008 | Kim et al. ...................... | 257/401 |
| 2008/0237655 A1* | 10/2008 | Nakabayashi et al. ........ | 257/255 |
| 2008/0258207 A1* | 10/2008 | Radosavljevic et al. ...... | 257/327 |

FOREIGN PATENT DOCUMENTS

JP 2010-192518 9/2010

* cited by examiner

*Primary Examiner* — Long K Tran
*Assistant Examiner* — Dzung Tran
(74) *Attorney, Agent, or Firm* — Patterson & Sheridan, LLP

(57) ABSTRACT

A semiconductor device is implementated that includes a source region, multiple elongated drain regions, a channel region, a source electrode, a drain electrode, and a gate electrode. The source region is a flat planar region formed on a compound semiconductor layer. The multiple elongated drain regions are formed so that they are each electrically isolated from each other on the compound semiconductor layer. The channel region is formed so that it contacts one side of the source region and is electrically isolated from the source region and the multiple elongated drain regions. The source electrode is formed at least in a portion on top of the source region. The drain electrode is formed so that it is connected electrically to the multiple elongated drain regions. The gate electrode is formed so that it is connected electrically to the multiple channel regions.

20 Claims, 7 Drawing Sheets

US 8,872,282 B2

SEMICONDUCTOR DEVICE

CROSS-REFERENCE TO RELATED APPLICATION

This application is based upon and claims the benefit of priority from Japanese Patent Application No. 2011-231495, filed Oct. 21, 2011; the entire contents of which are incorporated herein by reference.

FIELD

Embodiments described herein relate to the semiconductor device.

BACKGROUND

Since the field effect transistor (FET) using gallium nitride (GaN), gallium arsenide (GaAs), or some other compound for semiconductors is capable of high output and has excellent high-frequency characteristics, it has been widely used in practice as the semiconductor device for use in the microwave spectrum.

For the conventional semiconductor device of this type, the flat planar active layer, including the flat planar drain region and the source region and the channel region between these, is usually formed on top of the compound semiconductor layer.

In such a semiconductor device, in order to accomplish higher output by applying a high voltage between the drain region and the source region, a high voltage resistance is required in the device.

DESCRIPTION OF THE DRAWINGS

FIG. 11A shows the state without the application of voltage to the gate electrode and FIG. 11B shows the state with the application of the voltage to the gate electrode.

DETAILED DESCRIPTION

A detailed description of one embodiment will be given with reference to the following diagrams.

According to the embodiment, there is provided a semiconductor device capable of improving voltage resistance in a semiconductor device.

In one embodiment, a semiconductor device is provided with a source region, multiple elongated drain regions, a channel region, a source electrode, a drain electrode, and a gate electrode. The source region is a flat planar region formed on top of a compound semiconductor layer. The multiple elongated drain regions are formed on the compound semiconductor layer so that they are each separated electrically from one another. The channel region is formed to contact one side of the source region and is separated electrically from the source region and the multiple elongated drain regions. The source electrode is formed with at least a portion thereof on top of the source region. The drain electrode is formed so that it is connected electrically to the multiple elongated drain regions. The gate electrode is formed so that it is connected electrically to the multiple channel regions.

Figure 1:
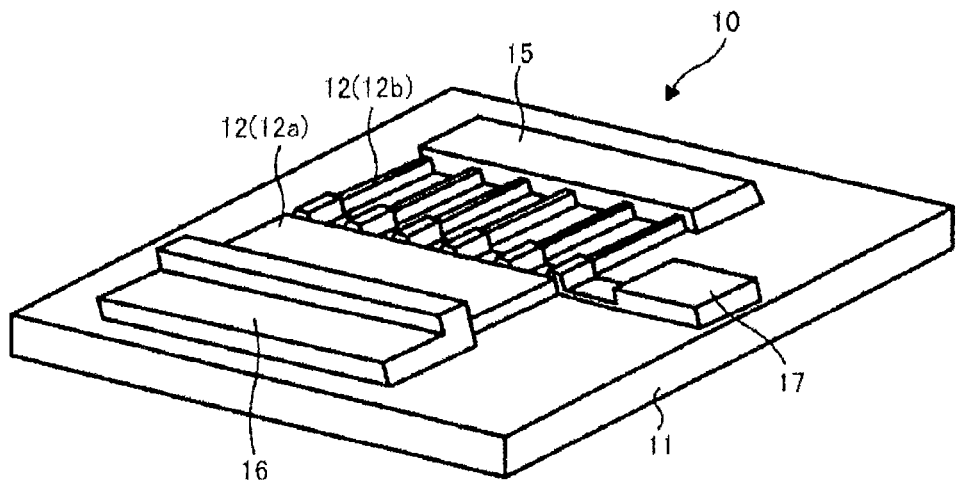
FIG. 1 is an isometric diagram showing the semiconductor device according to one embodiment.
Figure 2:
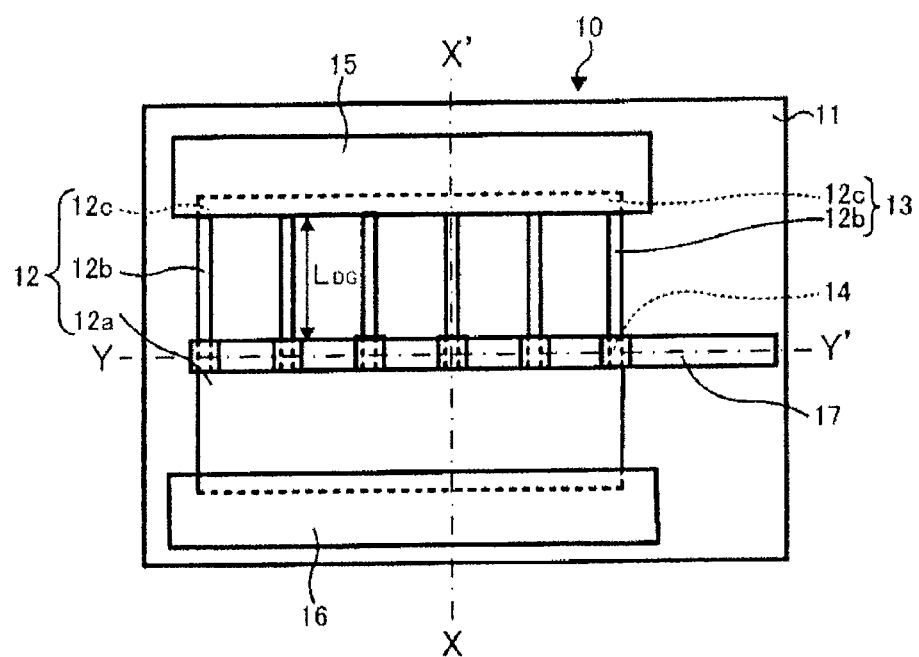
FIG. 2 is a top view diagram showing the semiconductor device of FIG. 1.
Figure 3:
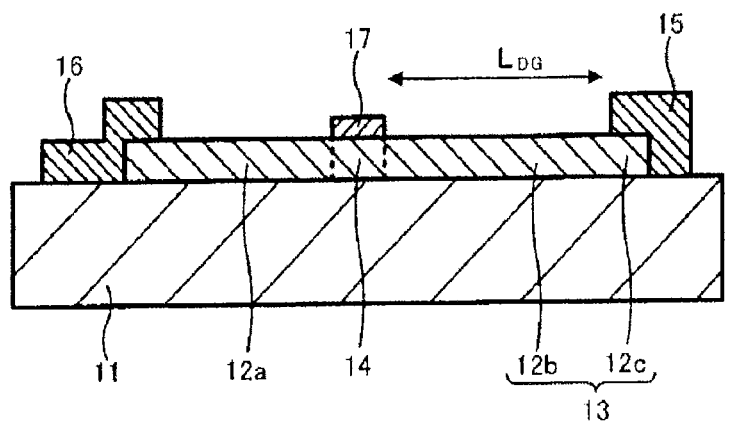
FIG. 3 is the cross-sectional diagram of the semiconductor device along section line X-X' of FIG. 2.
Figure 4:
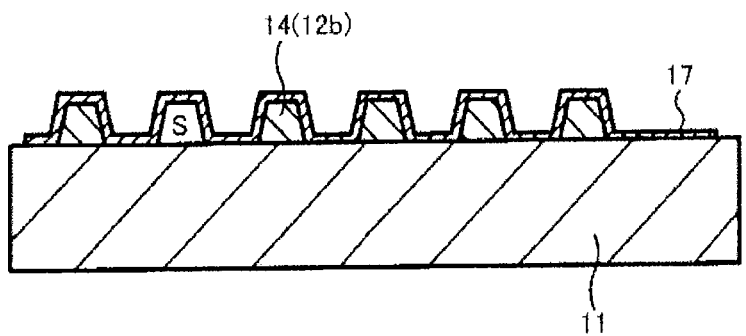
FIG. 4 is the cross-sectional diagram of the semiconductor device along section line Y-Y' of FIG. 2.

FIG. 1 is an isometric diagram schematically showing a semiconductor device related to the present embodiment. Furthermore, FIG. 2 is a top view diagram schematically showing the semiconductor device of FIG. 1. Moreover, FIG. 3 is a cross-sectional diagram of the semiconductor device along the section line X-X' of FIG. 2, and FIG. 4 is a cross-sectional diagram of the semiconductor device along the section line Y-Y' of FIG. 2.

As shown in FIG. 1, in the semiconductor device 10 of the present embodiment, an active layer 12 is formed on top of the surface of the compound semiconductor layer 11 as a layer for the flow of electric current. The compound semiconductor layer 11 is, for example, a bulk-shaped GaAs layer; and the active layer 12 is, for example, an n-GaAS layer doped to be an n-type semiconductor.

As shown in FIG. 2, the active layer 12 includes the flat planar section 12a, multiple elongated sections 12b, and the connection section 12c connected to one end of each of the multiple elongated sections 12b. The opposing end of each of the multiple elongated sections 12b is formed to contact the flat planar section 12a. Such multiple elongated sections 12b are formed substantially in parallel with each other and extend from a drain region 13 toward the flat planar section 12a. The multiple elongated sections 12b are each separated electrically from one another. In one example, the multiple elongated sections 12b are each electrically separated from each other by each being formed in with a mesa configuration that is rectangular in cross-section in a plane perpendicular to an axis of elongation of the multiple elongated sections 12b. In some embodiments, the active layer 12 has a uniform thickness throughout.

In some embodiments, the connection section 12c of the active layer 12 is not necessarily formed. In such embodiments, the active layer 12 is one with a portion of the flat planar section 12a, which is formed in a comb shape.

The flat planar section 12a is the source region 12a; the drain region 13 includes the multiple elongated drain sections 12b and the connection section 12c connected to one end of each of the multiple elongated drain sections 12b. The drain region 13 electrically connects each of the multiple elongated drain sections 12b to the drain electrode 15. Furthermore, a channel region 14 is disposed in the multiple elongated sections 12b in the portion containing the end connected to the flat planar section 12a. In other words, the channel region 14 is disposed between the flat planar source region 12a and the drain region 13.

As shown in FIG. 2, the drain electrode 15 is formed on top of the compound semiconductor layer 11 and contains the connection section 12c of the active layer 12. Furthermore, the source electrode 16 is formed on top of the compound semiconductor layer 11 that contains at least a portion of the flat planar source region 12a of the active layer 12. The drain electrode 15 and the source electrode 16 are made of, for example, gold (Au) or other ohmic metals.

In an embodiment that does not include the formation of the connection section 12c of the active layer 12, the drain electrode 15 may be formed on top of the compound semiconductor layer 11 containing one end of the multiple elongated drain sections 12b.

On top of the compound semiconductor layer 11 that contains the other end of the multiple elongated drain sections 12b of the active layer 12, that is, on top of the compound semiconductor layer 11 containing the channel region 14, a gate electrode 17 is formed. The gate electrode 17 is formed transversely on the multiple elongated drain sections, i.e., the gate electrode 17 extends in the direction crossing the multiple elongated drain sections 12b. In doing so, the gate electrode 17 is formed so that it does not overlap the drain electrode 15 or the source electrode 16 as shown in FIG. 1 and, at the same time, it covers the periphery of the various channel regions 14 as shown in FIG. 4. This gate electrode 17 is, for example, made of titanium (Ti) or other Schottky metals.

Since the gate electrode 17 is formed so that it does not overlap the drain electrode 15 or the source electrode 16, it is unnecessary to form any of the drain electrode 15, the source electrode 16, and the gate electrode 17 in a bridge form, and the manufacturing is easy. Furthermore, since the drain electrode 15, the source electrode 16, and the gate electrode 17 are not mutually overlapped, manufacturing issues associated with such overlapping structures are avoided.

Furthermore, since the gate electrode 17 is formed so that it covers the periphery of the various channel regions 14, the gate voltage is applied from three directions in the various channel regions 14. Therefore, in comparison to a conventional semiconductor device with the formation of a gate electrode on top of the channel region, the mutual conductance (gm) is high, and the semiconductor device 10 can be operated at a relatively lower voltage.

Next, in regard to the method for the manufacture of the semiconductor device 10 described above, an explanation will be given with reference to FIGS. 5-10. FIGS. 5-10 are top view diagrams similar to FIG. 2 for the explanation of the processes for the manufacture of the semiconductor devices related to the respective implementation embodiments.

Figure 5:
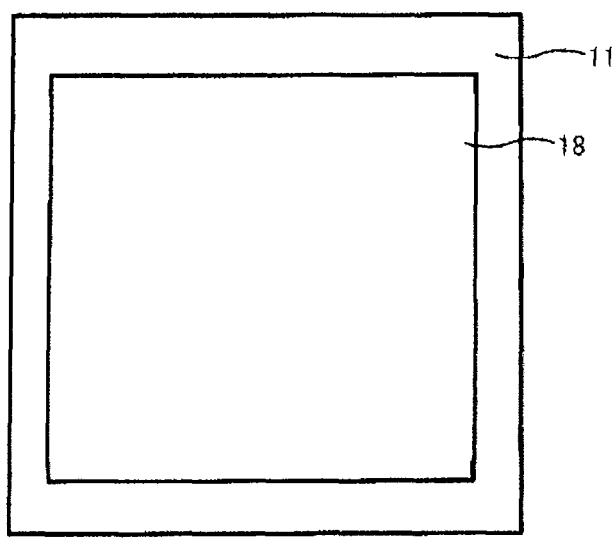
FIG. 5 is a top view diagram of the semiconductor device of FIG. 1 showing the formation of an active semiconductor layer on top of a compound semiconductor layer, according to an embodiment of the invention.

As shown in FIG. 5, in the specified region on top of the surface of the compound semiconductor layer 11, the flat planar active layer 18 is formed. In an embodiment in which the compound semiconductor layer 11 is a bulk-shaped GaAs layer, for example, as the active layer 18, the n-GaAs layer is doped to the n-type with, for example, the implanter or the like. In particular, the n-GaAs layer as the flat planar active layer 18 is formed by, for example, implant isolation or by MESA etching.

Figure 6:
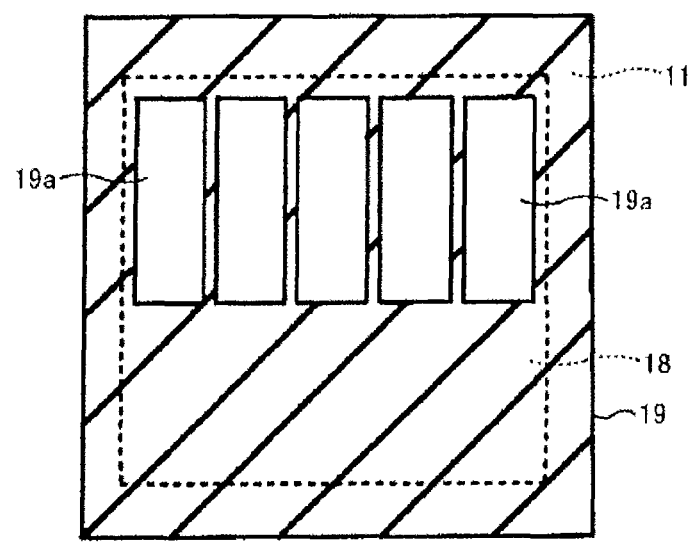
FIG. 6 is a top view diagram of the semiconductor device of FIG. 1 showing a first resist layer for the patterning of the active semiconductor layer in FIG. 5, according to an embodiment of the invention.

Next, as shown in FIG. 6, a first resist layer 19 is formed on the compound semiconductor layer 11 that contains the flat planar active layer 18. The first resist layer allows for the processing of the flat planar active layer 18 into the shape of the active layer 12 shown in FIG. 1, or the like. The first resist layer 19 has the respective opening sections 19a in the corresponding regions between the portions formed by the multiple elongated drain sections 12b of the active layer 12 (FIG. 1 and so on). Such a first resist layer 19, after the coating of the overall resist material on top of the compound semiconductor layer 11, can be formed by patterning of the resist material.

Figure 7:
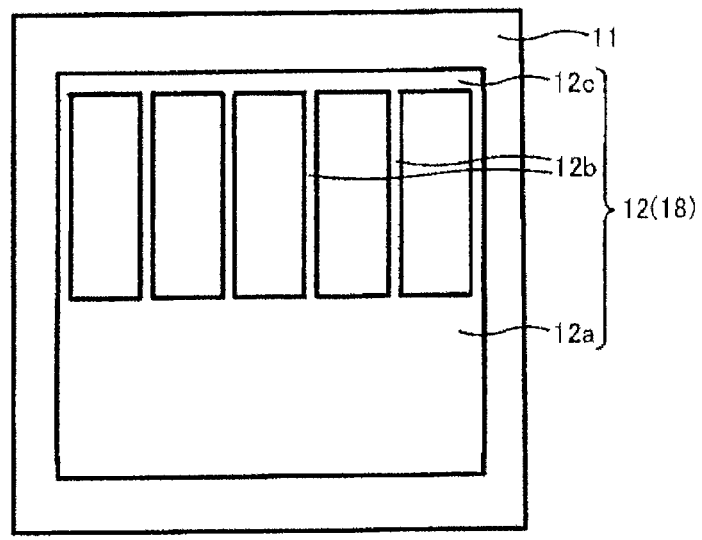
FIG. 7 is a top view diagram of the semiconductor device of FIG. 1 showing the formation of the active semiconductor layer, according to an embodiment of the invention.

Next, by using the first resist layer 19 as the mask, the flat planar active layer 18 is processed by, for example, a resistive ion etching (RIE) method. In doing so, as shown in FIG. 7, the flat planar active layer 18 is processed to the active layer 12 including the flat planar section 12a, the mutually electrically isolated multiple elongated drain sections 12b, and the connection section 12c.

Figure 8:
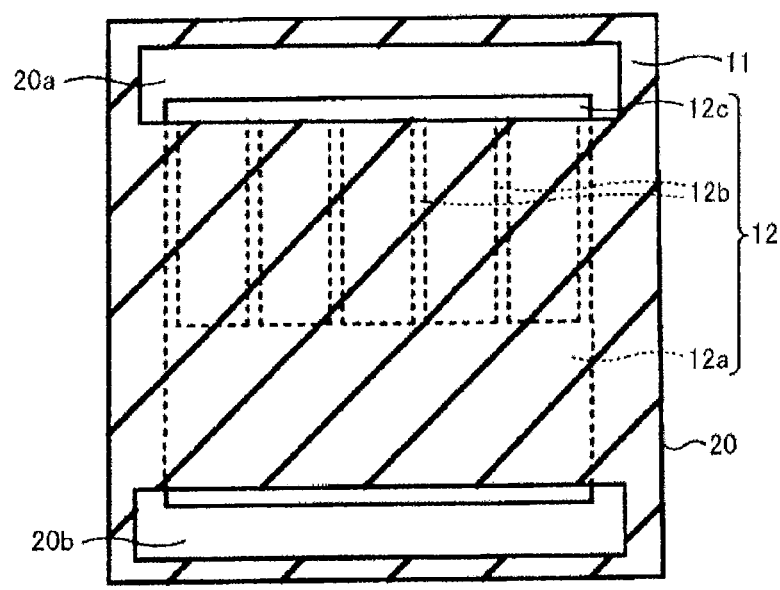
FIG. 8 is a top view diagram of the semiconductor device of FIG. 1 showing a second resist layer for the formation of a drain electrode and a source electrode on top of the compound semiconductor layer containing the active layer, according to an embodiment of the invention.

Next, as shown in FIG. 8, on top of the compound semiconductor layer 11 containing the active layer 12, the second resist layer 20 for the formation of the drain electrode 15 (FIG. 1 and so on) and the source electrode 16 (FIG. 1 and so on) is formed. The second resist layer 20 has at least an opening section 20a for the exposure of the compound semiconductor layer 11 containing the connection section 12c of the active layer 12 and at least an opening section 20b for the exposure of the compound semiconductor layer 11 containing a portion of the flat planar section 12a of the active layer 12. Such a second resist layer 20 can be formed in the same manner as the first resist layer 19.

Figure 9:
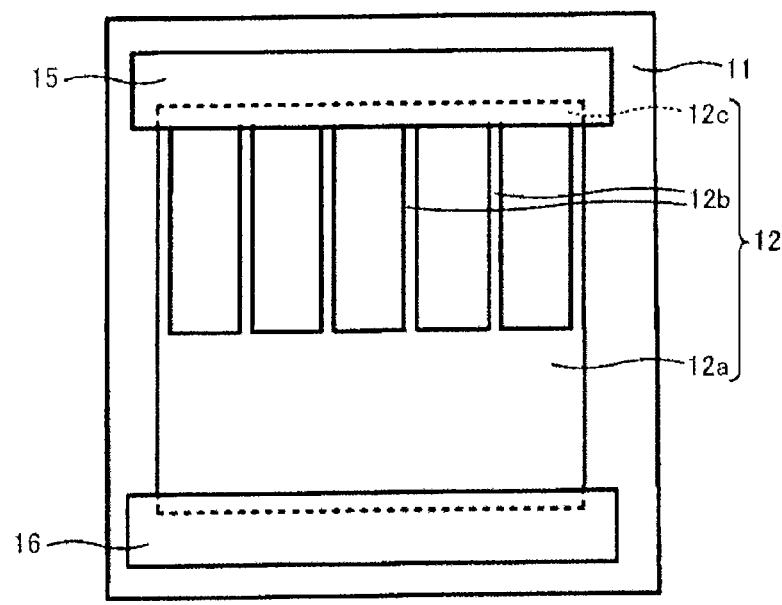
FIG. 9 is a top view diagram of the semiconductor device of FIG. 1 showing the formation of the drain electrode and the source electrode on top of the compound semiconductor layer containing the active layer, according to an embodiment of the invention.

Next, by using the second resist layer 20 as the mask, as shown in FIG. 9, on top of the compound semiconductor layer 11 (which contains the connection section 12c of the active layer 12), the drain electrode 15 is formed and, concurrently, the source electrode 16 is formed on top of the compound semiconductor layer 11. For the drain electrode 15 and source electrode 16, first of all, by using the second resist layer 20 as the mask, the vapor deposition of, for example, Au or other ohmic metals is carried out. In a subsequent process step, for example, by the lift-off method, the second resist layer 20 and the ohmic metal vapor deposited on top of this layer 20 are removed. Finally, the remaining ohmic metal is heat-treated. By a series of these processes, the drain electrode 15 and source electrode 16 are formed.

Figure 10:
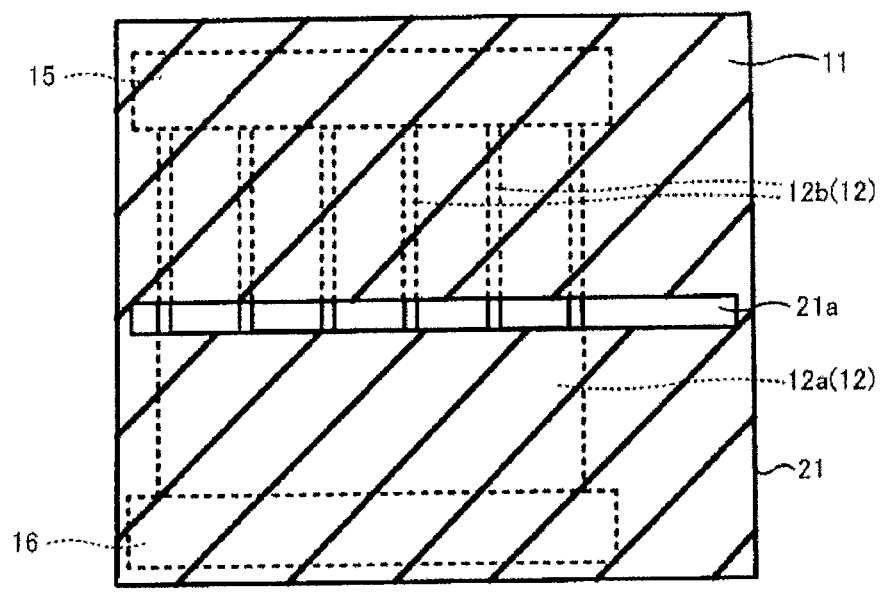
FIG. 10 is a top view diagram of the semiconductor device of FIG. 1 showing a third resist layer for the formation of a gate electrode on top of the compound semiconductor layer containing the active layer, according to an embodiment of the invention.

Next, as shown in FIG. 10, on top of the compound semiconductor layer 11 containing the active layer 12, the third resist layer 21 for the formation of the gate electrode 17 (FIG. 1 and so on) is formed. The third resist layer 21 has an opening section 21a for the exposure in an elongated shape of the compound semiconductor layer 11 containing the other end of the multiple elongated drain sections 12b of the active layer 12, so that it crosses the multiple elongated drain sections 12b. Such a third resist layer 21 can also be formed in the same manner as the first and second resist layers 19 and 20.

Finally, by using the third resist layer 21 as the mask, on top of the compound semiconductor layer 11 containing the other end of the multiple elongated drain sections 12b of the active layer 12, the gate electrode 17 is formed. The gate electrode 17 can be formed in the same manner as the drain electrode 15 and source electrode 16, except that, for example, Ti or some other Schottky metal are vapor-deposited.

By a series of these processes described above, the semiconductor device 10 related to the present embodiment can be manufactured.

Figure 11A:
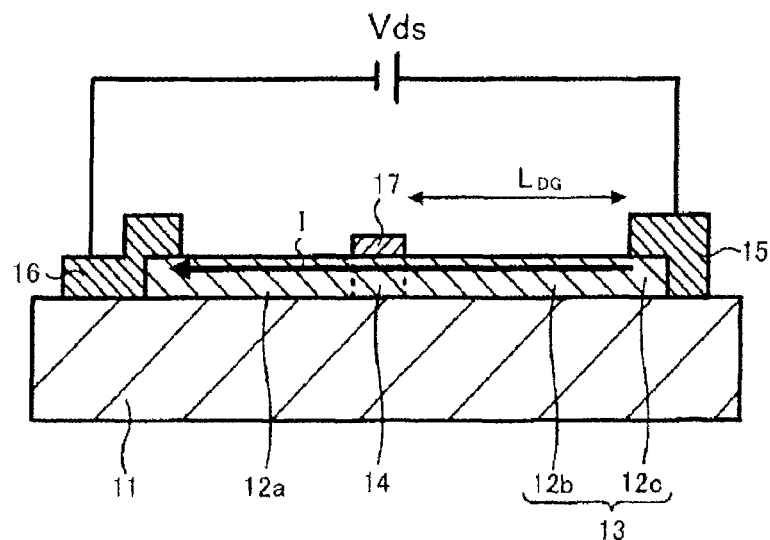
FIGS. 11A and 11B are cross-sectional diagrams of the semiconductor device formed according to an embodiment of the invention.
Figure 11B:
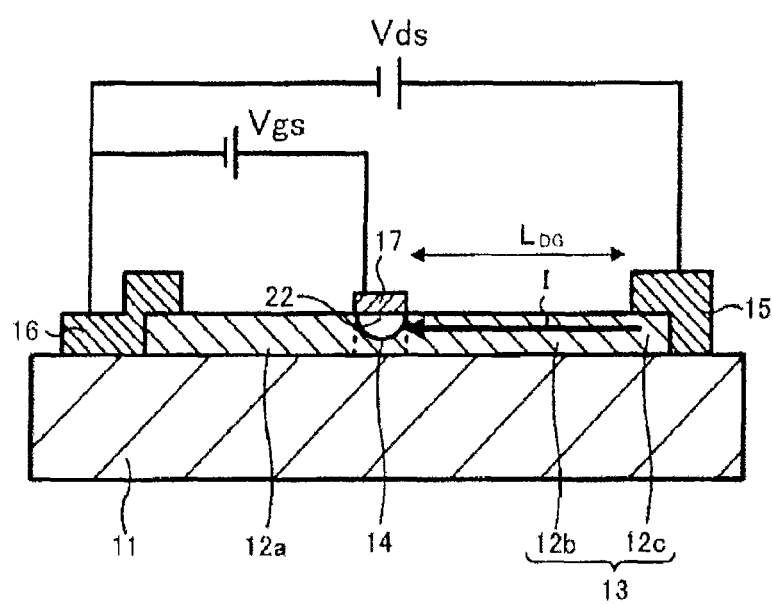

Next, in regard to the actions of the semiconductor device 10 related to the present embodiment manufactured in this manner, an explanation will be given with reference to FIGS. 11A and 11B. FIGS. 11A and 11B are cross-sectional diagrams similar to FIG. 3 an illustrate the operation of the semiconductor device related to the present embodiment; FIG. 11A shows the state without the application of voltage to the gate electrode and FIG. 11B shows the state with the application of voltage to the gate electrode.

As shown in FIG. 11A, if the voltage Vds is applied between the source electrode 16 and the drain electrode 15, as shown by the arrow symbol of FIG. 11A, the electric current I will flow between the drain and the source.

In this state, if the voltage Vgs is applied to the gate electrode 17, in the channel region 14, a depletion layer 22 is formed as shown in FIG. 11B. In this manner, the electric current I will be shut off.

In this way, by turning ON/OFF the voltage applied to the gate electrode 17, the electric current I between the drain and the source can be controlled.

In the semiconductor device 10 related to the implementation embodiment explained above, the drain region 13 is constituted by the multiple elongated drain sections 12b, which are mutually isolated from each other electrically. Therefore, in comparison to a conventional semiconductor device having the flat planar drain region, without increasing the area of the device, the resistance between the drain and gates can be increased. The voltage resistance of the semiconductor device 10 increases mainly with an increase in resistance between the drain and gate. Therefore, with respect to the semiconductor device 10 of the present embodiment, the voltage resistance can be improved.

To improve the voltage resistance without increasing the area of the device, decreasing the cross-sectional area S (FIG. 4) of the drain region 14 increases the resistance between the drain and gates. Furthermore, by prolonging the length $L_{DG}$ (FIGS. 2 and 3) between the drain and the gates, the resistance between the drain and gates can be increased.

While certain embodiments have been described, these embodimentts have been presented by way of example only, and are not intended to limit the scope of the embodiments. Indeed, the novel embodiments described herein may be embodied in a variety of other forms; furthermore, various omissions, substitutions, and changes in the form of the embodiments described herein may be made without departing from the spirit of the embodiments. The accompanying claims and their equivalents are intended to cover such forms or modifications as would fall within the scope and spirit of the embodiments.

Figure 12:
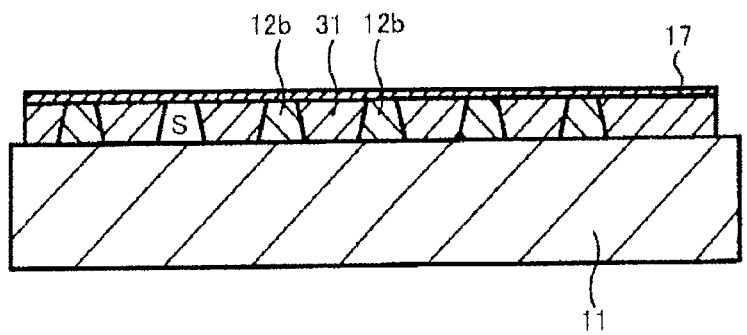
FIG. 12 is a cross-sectional diagram of a semiconductor device formed according to an embodiment of the invention showing a modified example of the semiconductor device, according to an embodiment of the invention.

For example, the multiple elongated drain sections 12b of the active layer 12, as shown in FIG. 12, may also be mutually separated electrically by the provision of a separation layer 32 that is an impurity layer of the electrical conduction type opposite that of the multiple elongated drain sections 12b.

The structure shown in FIG. 12, by using the first resist layer 19 shown in FIG. 6 as the mask, on the flat planar active layer 18, by the injection of ions of the electrical conduction type opposite to this active layer 18, can be formed.

Figure 13:
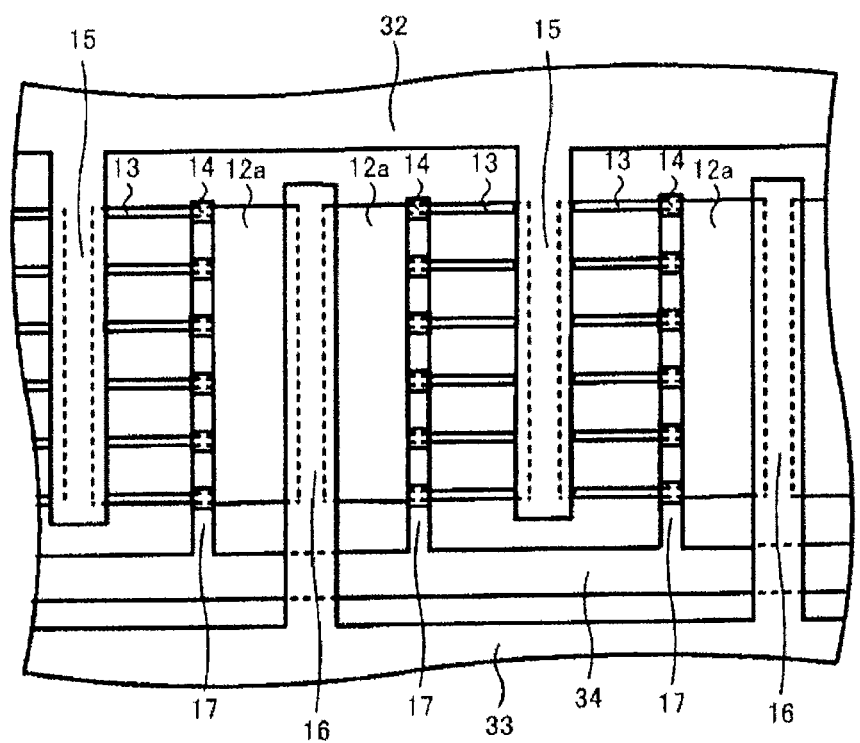
FIG. 13 is a top view diagram corresponding to FIG. 2 and schematically showing the major parts of the modified example of the semiconductor device of FIG. 12.

The semiconductor device 10 related to the implementation embodiment described above is a single FET. However, in another embodiment, a semiconductor device, as shown in FIG. 13, can also be configured as a structure with multiple FETs in parallel. In other words, it can also be the structure in which the multiple drain electrodes 15 are connected to the drain pad 32 and, at the same time, the multiple source electrodes 16 are connected to the source pad 33 and the multiple gate electrodes 17 are connected to the gate pad 34, respectively. In this semiconductor device, since the source electrode 16 and the gate pad 34 are in the overlapped structure, the source electrode 16 uses, for example, an air bridge wiring structure for electrical isolation from the gate pad 34.

Furthermore, in the semiconductor device 10 related to the embodiment described above, the compound semiconductor layer 11 is GaAs and the active layer 12 is n-GaAs. However, other materials of the compound semiconductor layer and the active layer may also be used. For example, even if the compound semiconductor layer is GaN and the active layer 12 is n-GaN, the same effect as the effect related to the implementation embodiment can be achieved.

What is claimed is:

1. A semiconductor device comprising:
a source region electrically connected to a source electrode;
a plurality of elongated drain regions that are each electrically connected to a single drain electrode and physically isolated from each other and extend from the drain electrode toward the source electrode; and
a channel region disposed between the source region and the plurality of elongated drain regions, the source region having a flat planar shape with a width greater than or equal to a width of the plurality of elongated drain regions, the channel region contacting a side of the source region and coupled to an end of each elongated drain region.

2. The semiconductor device according to claim 1, wherein the elongated drain regions are oriented substantially parallel to each other.

3. The semiconductor device according to claim 1, wherein the elongated drain regions, the source region, and the channel region are formed in a single material layer and each has a same thickness in a direction perpendicular to a direction extending from the drain electrode toward the source electrode, and portions of the single material layer between the elongated drain regions have been removed to physically isolate the elongated drain regions from each other.

4. The semiconductor device according to claim 3, wherein the single material layer is formed from a compound semiconductor layer.

5. The semiconductor device according to claim 4, wherein the single material layer comprises an active semiconductor layer formed by doping portions of the compound semiconductor layer.

6. The semiconductor device according to claim 1, further comprising a single connection region that is oriented transversely to an axis of elongation of the elongated drain regions and electrically connects the elongated drain regions and the drain electrode.

7. The semiconductor device according to claim 6, wherein the elongated drain regions, the source region, the channel region, and the connection region are formed in a single material layer.

8. The semiconductor device according to claim 7, wherein the single material layer is formed from a compound semiconductor layer.

9. The semiconductor device according to claim 1, further comprising a gate electrode disposed transversely on each of the elongated drain regions.

10. The semiconductor device according to claim 9, wherein the gate electrode is rectangular in cross-section in a plane perpendicular to an axis of elongation of the elongated drain regions.

11. The semiconductor device according to claim 9, wherein a portion of the gate electrode that is disposed on a one of the elongated drain regions is disposed on multiple sides thereof.

12. A semiconductor device, comprising:
a flat planar source region electrically connected to a source electrode;
a plurality of elongated drain regions that are each electrically connected to a single drain electrode and physically isolated from each other;
a channel region disposed between the flat planar source region and the plurality of elongated drain regions; and
a gate electrode disposed transversely on each of the elongated drain regions,
wherein a portion of the gate electrode that is disposed on a one of the elongated drain regions is disposed on multiple sides thereof, and the flat planar source region has a width greater than or equal to a width of the plurality of elongated drain regions, the channel region contacting a side of the flat planar source region and coupled to an end of each elongated drain region.

13. The semiconductor device according to claim 12, wherein the gate electrode is rectangular in cross-section in a plane perpendicular to an axis of elongation of the elongated drain regions.

14. The semiconductor device according to claim 13, wherein the portion of the gate electrode disposed on the one of the elongated drain regions is disposed on three sides thereof.

15. The semiconductor device according to claim 12, wherein the elongated drain regions, the flat planar source region, and the channel region are formed in a single material layer and each has a same thickness in a direction perpendicular to a direction extending from the drain electrode toward the source electrode, and portions of the single material layer have been removed to physically isolate the elongated drain regions from each other.

16. The semiconductor device according to claim 15, wherein the single material layer is formed from a compound semiconductor layer.

17. The semiconductor device according to claim 16, wherein the single material layer comprises an active semiconductor layer formed by doping portions of the compound semiconductor layer.

18. The semiconductor device according to claim 12, further comprising a single connection region that is oriented transversely to an axis of elongation of the elongated drain regions and electrically connects the elongated drain regions to the drain electrode.

19. The semiconductor device according to claim 18, wherein the elongated drain regions, the flat planar source region, the channel region, and the connection region are formed in a single material layer.

20. A semiconductor device comprising:
a flat planar source region formed on a compound semiconductor layer;
a plurality of elongated drain regions that are each formed on the compound semiconductor layer and are physically isolated from each other;
a plurality of channel regions, each channel region contacting a same side of the flat planar source region;
a source electrode at least a portion of which is on the flat planar source region;
a drain electrode that is electrically connected to the plurality of elongated drain regions; and
a gate electrode that is electrically connected to the plurality of channel regions.

* * * * *